US008179386B2

(12) United States Patent
Katoh et al.

(10) Patent No.: US 8,179,386 B2
(45) Date of Patent: May 15, 2012

(54) OPTICAL SENSOR AND DISPLAY DEVICE PROVIDED WITH THE SAME

(75) Inventors: Hiromi Katoh, Osaka (JP); Christopher Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 288 days.

(21) Appl. No.: 12/673,454

(22) PCT Filed: Aug. 5, 2008

(86) PCT No.: PCT/JP2008/064025
§ 371 (c)(1),
(2), (4) Date: Feb. 12, 2010

(87) PCT Pub. No.: WO2009/022577
PCT Pub. Date: Feb. 19, 2009

(65) Prior Publication Data
US 2011/0199349 A1 Aug. 18, 2011

(30) Foreign Application Priority Data

Aug. 10, 2007 (JP) ................................. 2007-209972

(51) Int. Cl.
*G06F 3/038* (2006.01)
*G09G 5/00* (2006.01)
(52) U.S. Cl. ........................................ 345/207; 345/204
(58) Field of Classification Search .................. 345/204, 345/156, 207; 348/227, 602
See application file for complete search history.

(56) References Cited

U.S. PATENT DOCUMENTS

| 2004/0043676 A1 | 3/2004 | Tada et al. |
| 2005/0045881 A1 | 3/2005 | Nakamura et al. |
| 2009/0066897 A1 | 3/2009 | Katoh et al. |

FOREIGN PATENT DOCUMENTS

| JP | 2000-332546 | 11/2000 |
| JP | 2005-311542 | 11/2005 |

OTHER PUBLICATIONS

International Search Report for PCT/JP2008/064025, mailed Oct. 28, 2008.
Nakamura, T. et al., "A Touch Panel Function Integrated LCD Including LTPS A/D Converter", SID 05 Digest, (2005), pp. 1054-1055.
Koide, S. et al., "LTPS Ambient Light Sensor with Temperature Compensation", IDW '06, (2006), pp. 689-690.

*Primary Examiner* — Ricardo L Osorio
(74) *Attorney, Agent, or Firm* — Nixon & Vanderhye P.C.

(57) ABSTRACT

The present invention provides an optical sensor at least some part of which is formed monolithically in an active matrix substrate of a display device. In order to detect ambient light with high accuracy by eliminating the influences of stray light and of property variations between photodetecting elements, the optical sensor includes a detection photodiode (11) and a reference photodiode (12) covered with a shielding film (15). The optical sensor further includes a differential amplifier (16) one input terminal of which is connected to the cathode of the detection photodiode (11) and the other input terminal is connected to the cathode of the reference photodiode (12), an integration capacitor (19) and a reset switch (22). The optical sensor further includes a comparator (21) and a low-pass filter (20) for making the electric potentials of the anodes of the reference photodiode (12) and detection photodiode (11) larger than the electric potential of the cathode of the reference photodiode (12) by the open-circuit voltage $V_{OC}$.

8 Claims, 6 Drawing Sheets

OPTICAL SENSOR AND DISPLAY DEVICE PROVIDED WITH THE SAME

This application is the U.S. national phase of International Application No. PCT/JP2008/064025 filed 5 Aug. 2008, which designated the U.S. and claims priority to JP Application No. 2007-209972 filed 10 Aug. 2007, the entire contents of each of which are hereby incorporated by reference.

TECHNICAL FIELD

The present invention relates to an optical sensor using a photodetecting element such as a photodiode, and particularly to an optical sensor at least some part of which is formed monolithically on an active matrix substrate of a display device.

BACKGROUND ART

Conventionally, display devices with a photodetection function capable of detecting ambient brightness by including a photodetecting element, such as a photodiode, in a peripheral region of pixels have been proposed. It is envisioned that such display devices with the photodetection function will be utilized as display devices capable of adjusting the light amount of a backlight in response to ambient brightness.

In some of these conventional display devices with the photodetection function, the photodiode is formed together in a semiconductor process for forming known components such as signal lines, scanning lines, TFTs (Thin Film Transistors) and pixel electrodes on the active matrix substrate (see Documents 1 and 3 below).

One of the major problems for the above-mentioned optical sensor at least some part of which is formed monolithically on an active matrix substrate of a display device is to eliminate the influence of light (stray light) other than the light to be primarily detected. In a display device having a backlight in particular, when output light from the backlight is reflected by a variety of components in the display device and the reflected light enters the photodiode as stray light, a significant error will be included in an optical sensor output.

Thus, in order to offset the influence of stray light, it has been known to provide, in addition to a detection photodiode, a photodiode (reference photodiode) that is configured not to receive light from the backlight and stray light (see Documents 2 and 4 below).

In conventional optical sensor including such a reference photodiode, generally, an offset to an output of the detection photodiode is corrected by inputting outputs of the detection photodiode and the reference photodiode to a differential amplifier and determining the difference between the outputs (see Document 4).

[Document 1] JP 2006-3857 A
[Document 2] EP 1394859 A2
[Document 3] T. Nakamura et al., "A Touch Panel Function Integrated LCD Including LIPS A/D Converter", SID 05 DIGEST, pp. 1054-1055, 2005
[Document 4] S. Koide et al., "LIPS Ambient Light Sensor with Temperature Compensation", IDW '06, pp. 689-690, 2006

DISCLOSURE OF INVENTION

Problem to be Solved by the Invention

However, as described above, the conventional optical sensor that correct the offset by determining the difference between the outputs of the detection photodiode and the reference photodiode has the following problem. When there are variations in properties of the detection photodiode and the reference photodiode, the difference is affected by the variations. Therefore, the electrical and optical properties of these photodiodes need to coincide with each other with high accuracy. When detecting light with low illumination in particular, an output detected by the detection photodiode becomes small. Thus, in some cases, an output of the reference photodiode becomes larger than that of the detection photodiode, and as a result, accurate detection of the difference becomes difficult because of the characteristics of the differential amplifier. Accordingly, to the conventional optical sensor at least some part of which is formed monolithically in the active matrix substrate of the display device, further improvements need to be made in order to detect ambient light with high accuracy by eliminating the influence of stray light and the influence of property variations between the photodetecting elements.

With the foregoing in mind, it is an object of the present invention to provide an optical sensor, at least some part of which is formed monolithically in an active matrix substrate of a display device and which is capable of detecting ambient light with high accuracy by eliminating the influence of stray light and the influence of property variations between photodetecting elements, and a display device using the optical sensor.

Means for Solving Problem

In order to solve the above-mentioned problems, the optical sensor according to the present invention is an optical sensor including a detection photodetecting element for detecting ambient light and a reference photodetecting element covered with a shielding film so as not to receive the ambient light. The optical sensor further includes: a differential amplifier, one input terminal of which is connected to the cathode of the detection photodetecting element and the other input terminal is connected to the cathode of the reference photodetecting element; an integration capacitor provided between the cathode of the detection photodetecting element and an output terminal of the differential amplifier; a reset switch for resetting the integration capacitor; and an electric potential control circuit connected to the cathode of the reference photodetecting element, the anode of the reference photodetecting element and the anode of the detection photodetecting element for making an electric potential of the anode of the reference photodetecting element and an electric potential of the anode of the detection photodetecting element larger than an electric potential of the cathode of the reference photodetecting element by the open-circuit voltage of the reference photodetecting element.

Further, the display device according to the present invention includes: an active matrix substrate provided with the optical sensor of the present invention according to the above configuration; and a display medium driven by the active matrix substrate.

Effect of the Invention

According to the present invention, it is possible to provided an optical sensor, at least some part of which is formed monolithically in an active matrix substrate of a display device and which is capable of detecting ambient light with high accuracy by eliminating the influence of stray light and the influence of property variations between photodetecting elements, and a display device using the optical sensor.

DESCRIPTION OF THE INVENTION

The optical sensor according to the present invention is an optical sensor including a detection photodetecting element for detecting ambient light and a reference photodetecting element covered with a shielding film so as not to receive the ambient light. The optical sensor further includes: a differential amplifier, one input terminal of which is connected to the cathode of the detection photodetecting element and the other input terminal is connected to the cathode of the reference photodetecting element; an integration capacitor provided between the cathode of the detection photodetecting element and an output terminal of the differential amplifier; a reset switch for resetting the integration capacitor; and an electric potential control circuit connected to the cathode of the reference photodetecting element, the anode of the reference photodetecting element and the anode of the detection photodetecting element for making an electric potential of the anode of the reference photodetecting element and an electric potential of the anode of the detection photodetecting element larger than an electric potential of the cathode of the reference photodetecting element by the open-circuit voltage of the reference photodetecting element.

According to this configuration, the electric potential control circuit for making the electric potentials of the anodes of the reference photodetecting element and the detection photodetecting element larger than the electric potential of the cathode of the reference photodetecting element by the open-circuit voltage of the reference photodetecting element is provided. Thus, at the beginning of an integration period that starts when the reset switch is opened after being closed once, the value of an electric potential of an output of the differential amplifier becomes constant regardless of the value of the open-circuit voltage of the reference photodetecting element. Consequently, the value of output voltage of the differential amplifier at the end of the integration period also becomes independent of the open-circuit voltage. As a result, an offset error does not occur at the differential amplifier and the intensity of ambient light that entered the detection photodetecting element can be detected with high accuracy. Furthermore, the output voltage of the differential amplifier at the end of the integration period always becomes a positive voltage. Thus, since there is no need to use a dual-polarity operation amplifier for the differential amplifier, the power consumption can be reduced.

In the above-described optical sensor, it is preferable that the electric potential control circuit includes: a comparator, one input terminal of which is connected to the cathode of the reference photodetecting element; and a low-pass filter or an analog-to-digital converter connected to an output of the comparator. In this configuration, the other input terminal of the comparator may be grounded or the other input terminal of the comparator may be connected to a predetermined reference voltage.

Further, in the above-described optical sensor, it is preferable that the detection photodetecting element and the reference photodetecting element are photodiodes.

Further, the display device according to the present invention includes: an active matrix substrate provided with the optical sensor according to any one of the above-mentioned configurations; and a display medium driven by the active matrix substrate. Further, the display device further includes a counter substrate facing the active matrix substrate, and the display medium is a liquid crystal interposed between the active matrix substrate and the counter substrate. In other words, the display device according to the present invention can be configured as a liquid crystal display device.

Hereinafter, specific embodiments of the present invention will be described with reference to the drawings. It should be noted, for each of the drawings to be made reference below, that only main components among the components used in embodiments of the present invention are shown in a simplified manner while the remaining components are not shown, for the purpose of convenience in explanation. Thus, the optical sensor according to embodiments of the present invention may include arbitrary components not shown in each of the drawings to be made reference in the specification.

Figure 1:
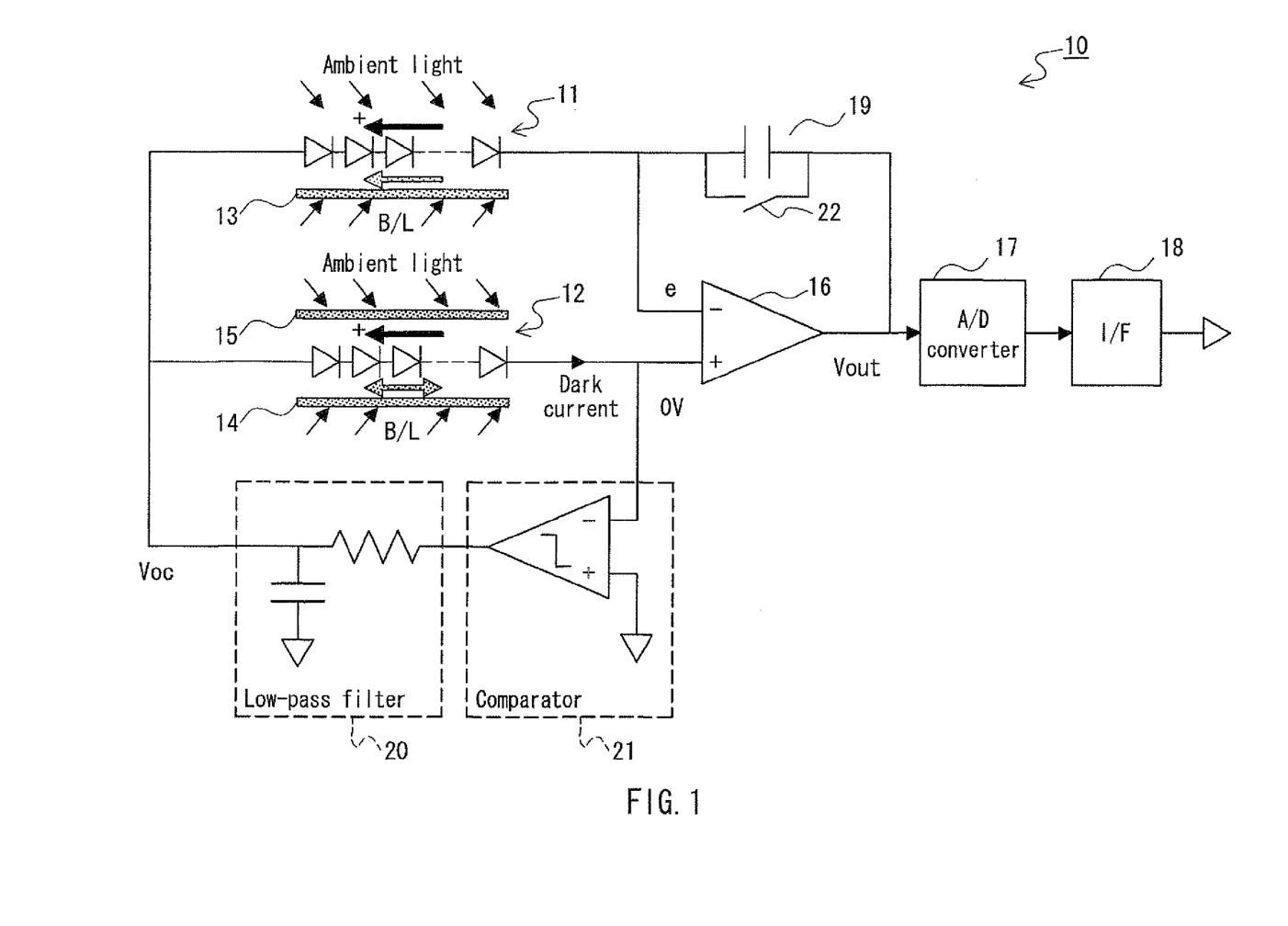
FIG. 1 is a circuit diagram showing a configuration of an optical sensor according to one embodiment of the present invention.

First, a configuration of an optical sensor according to one embodiment of the present invention will be described with reference to FIG. 1. FIG. 1 is a circuit diagram showing the configuration of an optical sensor 10 according to one embodiment of the present invention. As shown in FIG. 1, the optical sensor 10 according to the present embodiment includes a detection photodiode 11, a reference photodiode 12, shielding films 13 to 15, a differential amplifier 16, an A/D converter 17, an interface 18, an integration capacitor 19, a low-pass filter 20, a comparator 21 and a reset switch 22.

The detection photodiode 11 and the reference photodiode 12 are formed monolithically on an active matrix substrate of a liquid crystal display device. That is, the detection photodiode 11 and the reference photodiode 12 are formed together in the semiconductor process for forming TFTs (Thin Film Transistors) on the active matrix substrate. It is to be noted that the detection photodiode 11 is formed in a pixel region of the active matrix substrate and the reference photodiode 12 is formed in a region (outside of the pixel region) of the active matrix substrate not contributory to displaying.

On the backside (backlight side) of the detection photodiode 11 and the reference photodiode 12, the shielding films 13 and 14 for preventing light outputted from a backlight from entering the detection photodiode 11 and the reference photodiode 12 are provided, respectively. Further, the shielding film 15 for preventing ambient light as the target to be detected by the detection diode 11 from entering the reference photodiode 12 is provided on the front side (observer side) of the reference photodiode 12. The shielding films 13 to 15 may be formed together with a metal film and an opaque resin film constituting the active matrix substrate by utilizing these films.

Thus, the detection photodiode 11 receives ambient light and stray light and the reference photodiode 12 only receives stray light. It should be noted that stray light refers to components of light outputted from the backlight that enter the photodiodes as a result of being repeatedly reflected within the active matrix substrate. In other words, an output current of the detection photodiode 11 is composed of three kinds of components: (1) an optical current generated by detected light (ambient light), (2) an optical current generated by stray light and (3) a leakage current. On the other hand, since the reference photodiode 12 does not receive ambient light because of the shielding film 15, an output current thereof is composed of two kinds of components, (2) and (3).

The cathode of the detection photodiode 11 is connected to the inverting input terminal of the differential amplifier 16 and to the integration capacitor 19. The cathode of the reference photodiode 12 is connected to the noninverting input terminal of the differential amplifier 16. The reset switch 22 is connected between the inverting input terminal of the differential amplifier 16 and the output of the differential amplifier 16 in parallel to the integration capacitor 19.

To the anodes of the detection photodiode 11 and the reference photodiode 12, the comparator 21 and the low-pass filter 20 are connected so as to make anode voltages $V_{anode}$ equal to $V_{OC}$. The inverting input terminal of the comparator 21 is connected to the cathode of the reference photodiode 12. The noninverting input terminal of the comparator 21 is grounded. The output of the comparator 21 is connected to the low-pass filter 20.

Figure 2:
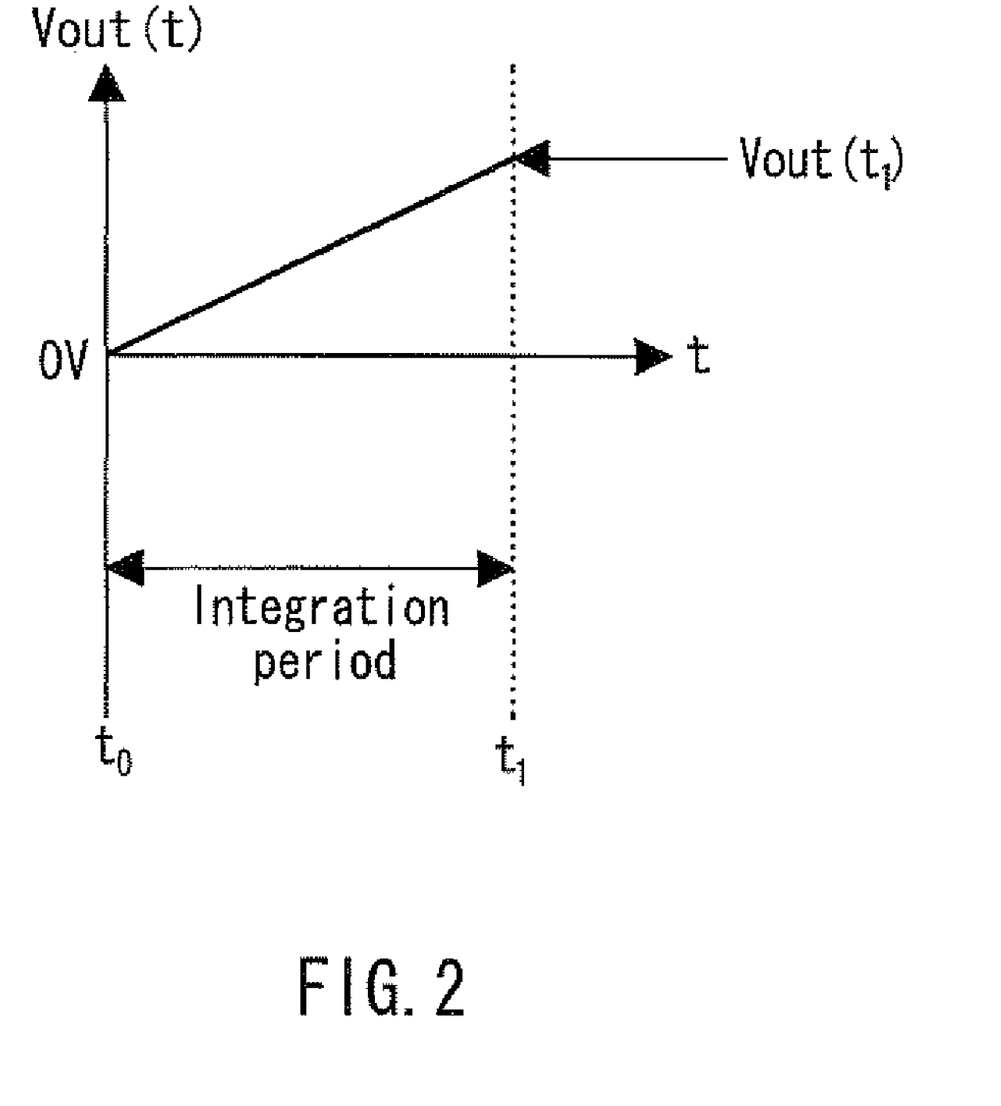
FIG. 2 is a graph showing an output of the differential amplifier during an integration period of the optical sensor shown in FIG. 1.

Next, the operation of the optical sensor 10 of the present embodiment according to the above configuration will be described with reference to FIG. 2.

First, the reset switch 22 is closed. Consequently, the voltage of the integration capacitor 19 is reset to 0V, and as shown in FIG. 2, an output voltage $V_{out}$ of the differential amplifier 16 becomes 0V. An integration period begins when the reset switch 22 is opened (time $t_0$). In an ideal state (state without a leakage current), an input current to the input terminals of the differential amplifier 16 is 0. Since the electric potential $V_{anode}$, of the anode of the reference photodiode 12 is equal to the open-circuit voltage $V_{OC}$ of the reference photodiode 12, the value of electric potential of the noninverting input terminal of the differential amplifier becomes constant (ideally 0V) regardless of the size of the open-circuit voltage $V_{OC}$. Although the size of the open-circuit voltage $V_{OC}$ varies depending on the amount of stray light received by the reference photodiode 12, even when the value of $V_{OC}$ is, for example, 0V or 1V, the value of $V_{out}(t_0)$ remains the same as shown in FIG. 2. In the ideal state, the differential amplifier 16 operates in such a manner that the difference between the electric potentials of the inverting input terminal and the noninverting input terminal is 0. Thus, the electric potential of the inverting input terminal of the differential amplifier 16 at the time to becomes 0V regardless of the size of the open-circuit voltage $V_{OC}$.

During the integration period, the detection photodiode 11 outputs a current $I_p$ in response to the intensity of light (ambient light+stray light) that enters the detection photodiode 11. The current is stored in the integration capacitor 19. Thus, the output of the differential amplifier 16 whose value is 0V at the time $t_0$ increases gradually during the integration period.

The rest switch 22 is closed at the end (time $t_1$) of the integration period. Output values of the differential amplifier 16 at the beginning and the end of the integration period are respectively converted by the A/D converter 17 and are outputted to the interface 18. And the difference between output voltages of the differential amplifier 16 at the beginning and the end of the integration period is sampled. The difference between the output voltages is equal to the integral of $I_p/C_{INT}$ in the integration period and it indicates the intensity of ambient light that entered the detection photodiode 11. As shown in FIG. 2, even when the value of $V_{OC}$ is 0V or 1V, $V_{out}(t)$ makes the same progression and the value of $V_{out}(t_1)$ remains the same.

As described above, the optical sensor 10 of the present embodiment is provided with the comparator 21 and the low-pass filter 22 so that the voltages $V_{anode}$ of the anodes of the detection photodiode 11 and the reference photodiode 12 become equal to the open-circuit voltage $V_{OC}$ of the reference photodiode 12. Thus, the value of the output voltage of the differential amplifier 16 at the beginning (time $t_0$) of the integration period becomes constant (ideally 0V) regardless of the size of the open-circuit voltage $V_{OC}$. Therefore, the value of output voltage of the differential amplifier 16 at the end (time $t_1$) of the integration period becomes independent of the open-circuit voltage $V_{OC}$. As a result, an offset error does not occur at the differential amplifier 16 and the intensity of ambient light that entered the detection photodiode 11 can be detected with high accuracy. Furthermore, the output voltage of the differential amplifier 16 at the end (time $t_1$) of the integration period always becomes a positive voltage. Thus, since there is no need to use a dual-polarity operation amplifier for the differential amplifier 16, the power consumption can be reduced.

Figure 3:
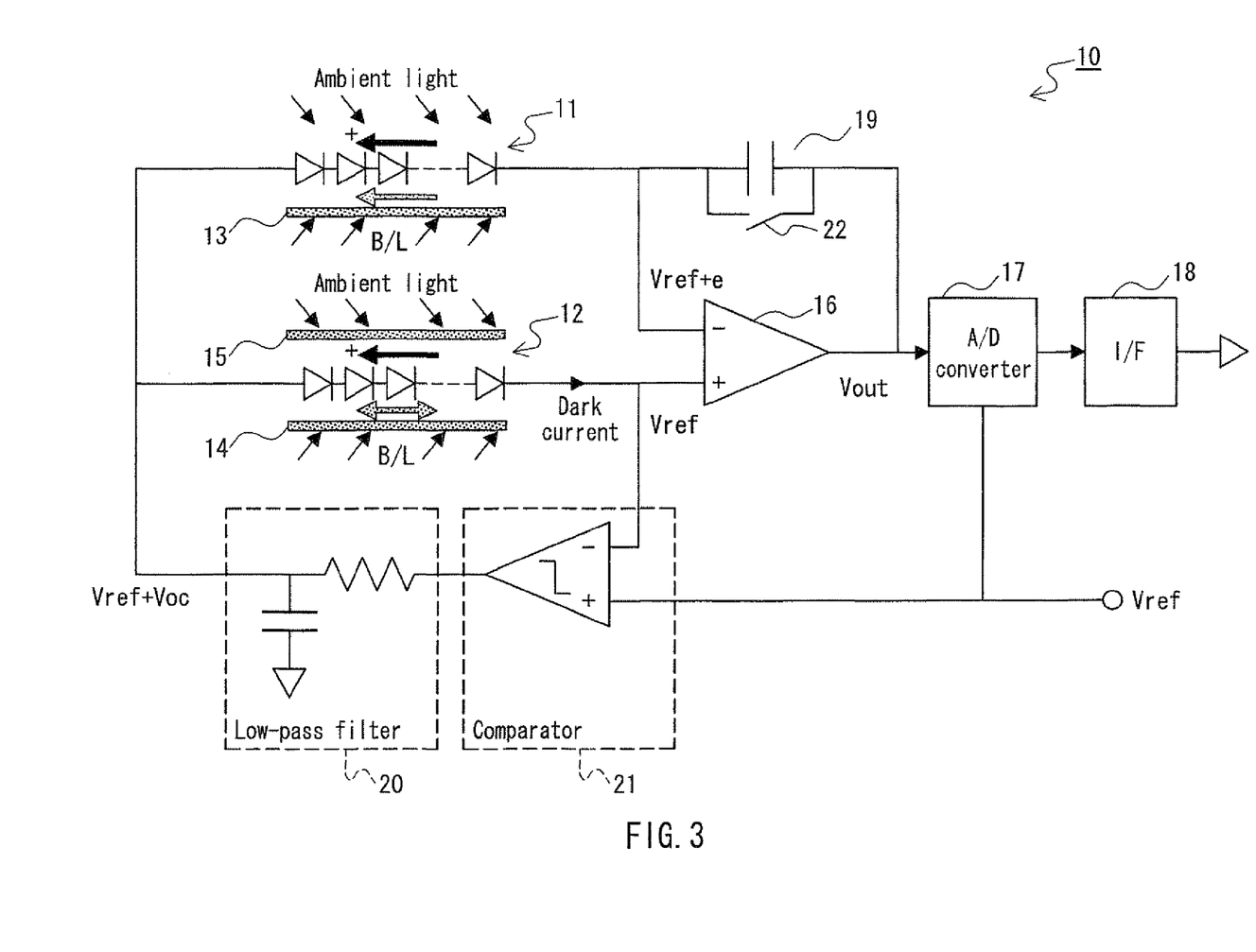
FIG. 3 is a circuit diagram showing a configuration of an optical sensor according to other embodiment of the present invention.
Figure 4:
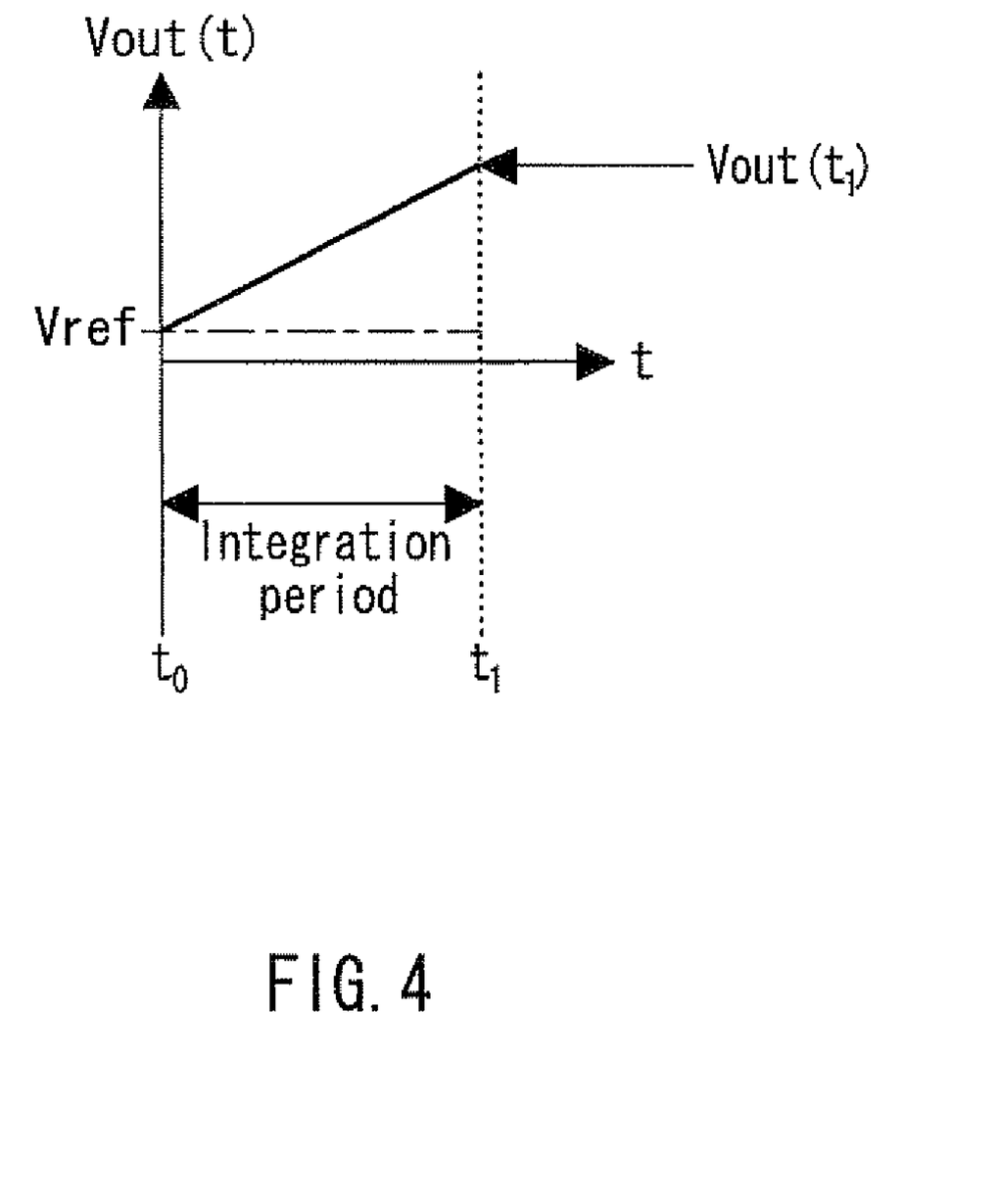
FIG. 4 is a graph showing an output of the differential amplifier during an integration period of the optical sensor shown in FIG. 3.

When at least one of the comparator 21 and the differential amplifier 16 cannot be operated at 0V, the noninverting input terminal of the comparator 21 may be connected to a reference voltage $V_{ref}$ of the A/D converter 17 as shown in FIG. 3. Consequently, the anode electric potential $V_{anode}$ of the detection photodiode 11 and the anode electric potential $V_{anode}$ of the reference photodiode 12 become equal to the sum of the open-circuit voltage $V_{OC}$ and the reference voltage $V_{ref}$. And as shown in FIG. 4, the electric potential of the noninverting input terminal of the differential amplifier 16 at the beginning (time $t_0$) of the integration period becomes equal to the reference voltage $V_{ref}$ regardless of the size of the open-circuit voltage $V_{OC}$ of the reference photodiode 12. Therefore, similarly to the configuration shown in FIG. 1, the value of the output voltage of the differential amplifier 16 at the end (time $t_1$) of the integration period becomes independent of the open-circuit voltage $V_{OC}$ also by the configuration shown in FIG. 3. As a result, an offset error does not occur at the differential amplifier 16 and the intensity of ambient light that entered the detection photodiode 11 can be detected with high accuracy. Furthermore, since the output voltage of the differential amplifier 16 at the end (time $t_1$) of the integration period always becomes a positive voltage, the power consumption of the differential amplifier 16 can be reduced similarly to the above configuration.

As described above, according to the optical sensor 10 of the present embodiment, ambient light can be detected with high accuracy by eliminating the influence of stray light and the influence of property variations between photodetecting elements.

Figure 5:
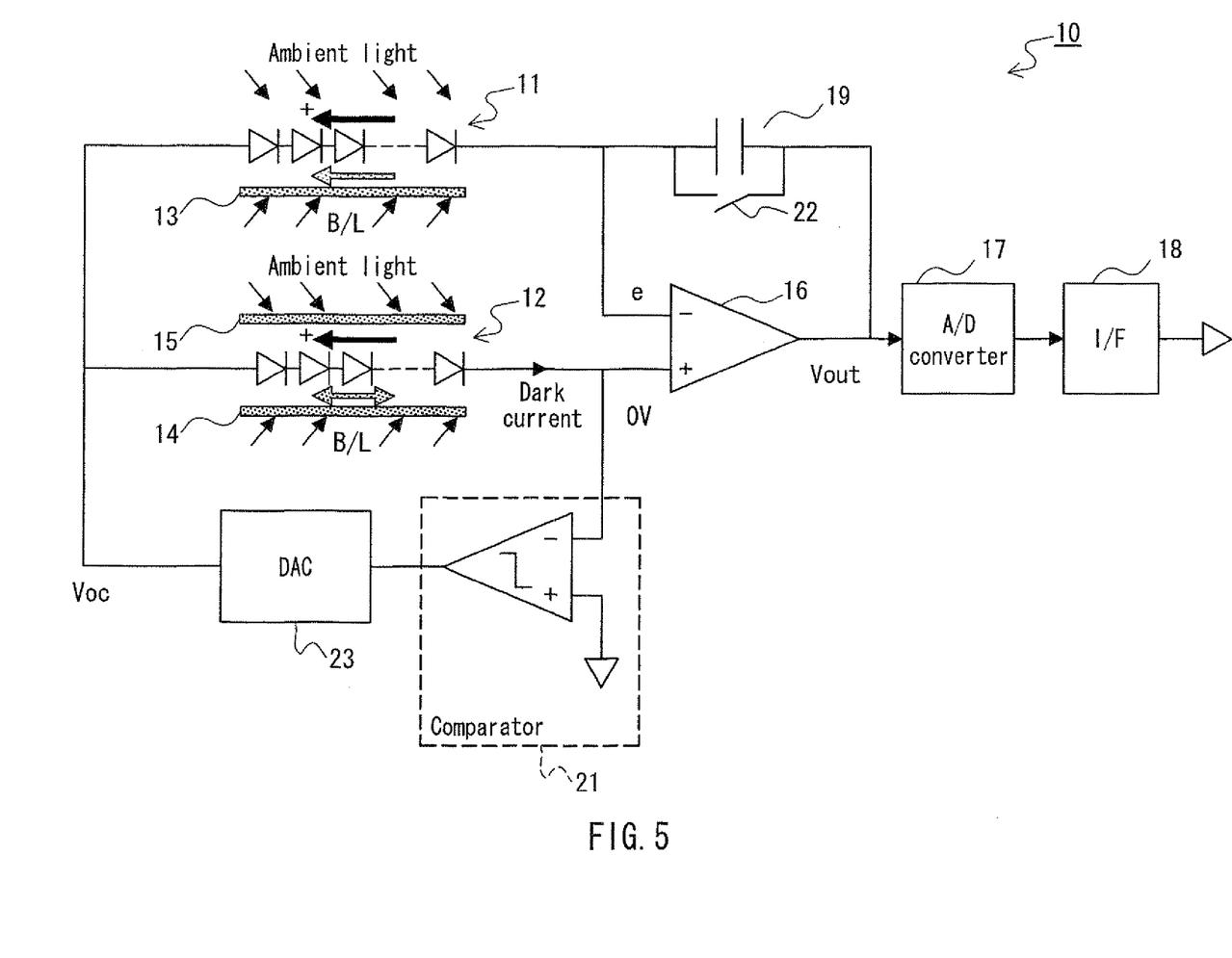
FIG. 5 is a circuit diagram showing a configuration of an optical sensor according to other embodiment of the present invention.

In FIG. 1, an example where an electric potential control circuit is composed of the comparator 21 one input terminal of which is connected to the cathode of the reference photodiode 12 and the low-pass filter connected to the output of the comparator 21 has been shown. However, as shown in FIG. 5, the similar effects can be achieved by using a D/A converter 23 in place of the low-pass filter 20. It is to be noted that also in the configuration shown in FIG. 5, similarly to the configuration shown in FIG. 3, the noninverting input terminal of the comparator 21 may be connected to the reference voltage $V_{ref}$ of the A/D converter 17.

Figure 6:
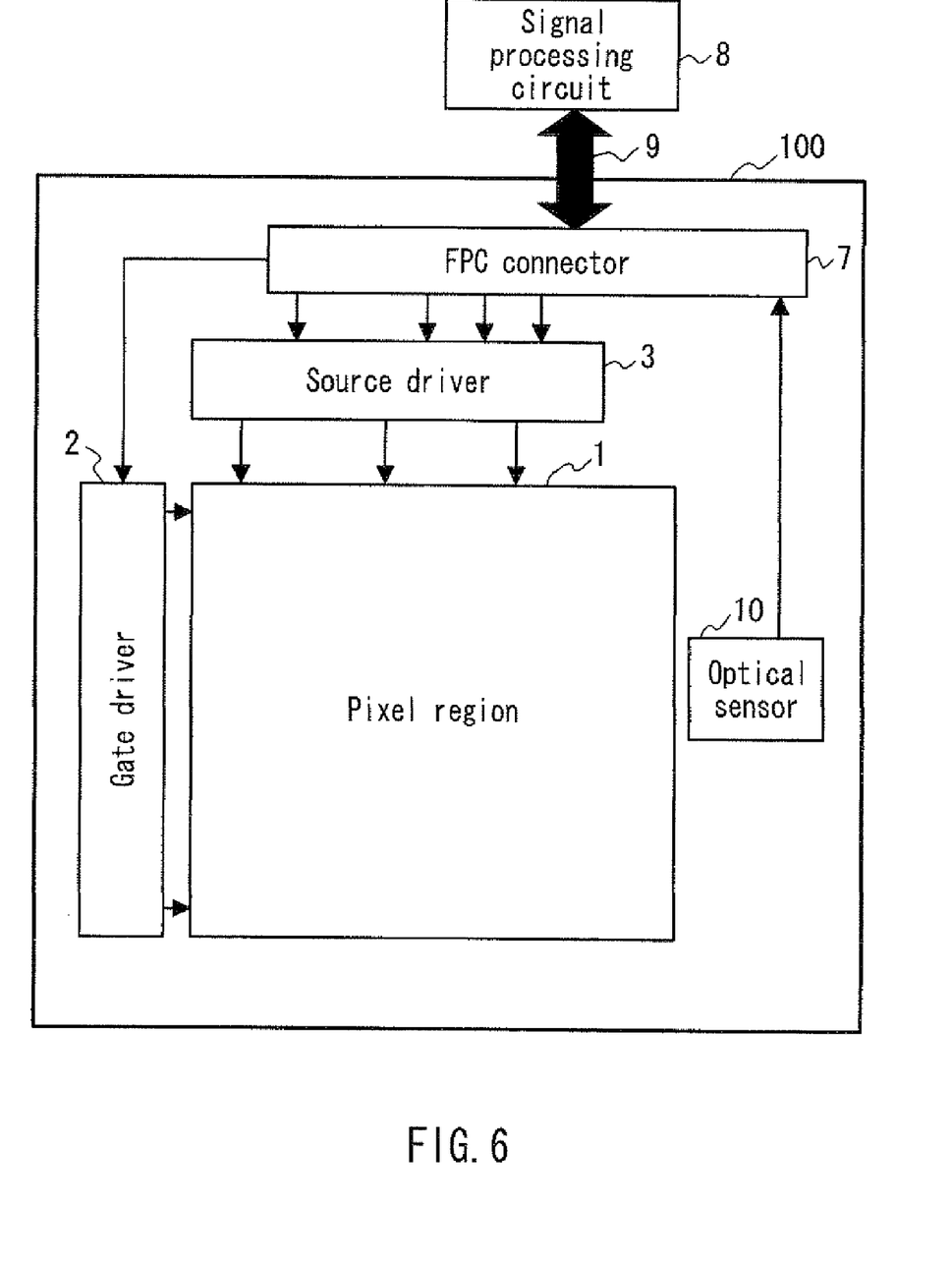
FIG. 6 is a block diagram showing a configuration of a display device according to one embodiment of the present invention.

Here, an example of a display device including the optical sensor of the present invention will be described. FIG. 6 is a block diagram showing a schematic configuration of an active matrix substrate provided with the optical sensor 10 used in a liquid crystal display device as an embodiment of the present invention. It is to be noted that the dimension of each block in the drawing of FIG. 6 does not necessarily indicate the actual dimension of the component indicated by each block and dimensional ratios among the respective components and the like.

As shown in FIG. 6, the active matrix substrate 100 included in the liquid crystal display device of the present embodiment includes at least a pixel region 1, a gate driver 2, a source driver 3 and an FPC connector 7 on a glass substrate.

The pixel region 1 is a region where a plurality of pixels are formed to display images. The optical sensor 10 is provided on the outside (i.e., on the non-display region) of the pixel region 1 on the glass substrate of the active matrix substrate 100. Further, a signal processing circuit 8 for processing an output of the optical sensor 10 is connected to the active matrix substrate 100 through the FPC connector 7 and an FPC 9. On the basis of the output of the optical sensor 10, the signal processing circuit 8 generates a control signal for adjusting the light amount of the backlight, for example.

The gate driver 2 is connected to the gates of TFTs in the pixel region 1 through gate bus lines and supplies gate driving signals. The source driver 3 is connected to the sources of the TFTs in the pixel region 1 through source bus lines and supplies image signals.

The components of the optical sensor 10 can be formed on the glass substrate of the active matrix substrate 100 together in the semiconductor process for forming the TFTs in the pixel region 1. However, all of the components of the optical sensor 10 do not need to be provided on the glass substrate. For example, among the components of the optical sensor 10 shown in FIG. 1, only the detection photodiode 11 and the reference photodiode 12 may be formed monolithically on the glass substrate of the active matrix substrate 100 and other components may be formed on the FPC 9 or within the signal processing circuit 8.

Further, the gate driver 2 and the source driver 3 on the active matrix substrate 100 can also be formed monolithically on the glass substrate in the semiconductor process for forming the TFTs in the pixel region 1. Or, the gate driver 2, the source driver 3 and at least some of the components of the optical sensor 10 other than the photodiode may be mounted on the glass substrate using the COG (Chip On Glass) technique or the like. The active matrix substrate 100 and a counter substrate (not shown) on which a counter electrode is entirely formed are bonded together and the space between the substrates is filled with a liquid crystal material.

Here, although an example of the display devices to which the optical sensor according to the present invention is applicable has been described, the number of the optical sensor to be provided in a display device and a method of driving the optical sensor can be determined arbitrarily. In the above embodiment, the liquid crystal display device has been described as an example of the display devices including the optical sensor according to the present invention. However, the display device according to the present invention is not limited to a liquid crystal display device. The present invention is applicable to any display devices using an active matrix substrate.

INDUSTRIAL APPLICABILITY

The present invention is industrially applicable as an optical sensor at least some part of which is formed monolithically in an active matrix substrate and a display device including the optical sensor.

The invention claimed is:

1. An optical sensor comprising a detection photodetecting element for detecting ambient light and a reference photodetecting element covered with a shielding film so as not to receive the ambient light,
the optical sensor further comprising:
 a differential amplifier, one input terminal of which is connected to a cathode of the detection photodetecting element and the other input terminal is connected to a cathode of the reference photodetecting element;
 an integration capacitor provided between the cathode of the detection photodetecting element and an output terminal of the differential amplifier;
 a reset switch for resetting the integration capacitor; and
 an electric potential control circuit connected to the cathode of the reference photodetecting element, the anode of the reference photodetecting element and the anode of the detection photodetecting element for making an electric potential of the anode of the reference photodetecting element and an electric potential of the anode of the detection photodetecting element larger than an electric potential of the cathode of the reference photodetecting element by an open-circuit voltage of the reference photodetecting element.

2. The optical sensor according to claim 1, wherein the electric potential control circuit includes:
 a comparator, one input terminal of which is connected to the cathode of the reference photodetecting element; and
 a low-pass filter connected to an output of the comparator.

3. The optical sensor according to claim 1, wherein the electric potential control circuit includes:
 a comparator, one input terminal of which is connected to the cathode of the reference photodetecting element; and
 an analog-to-digital converter connected to an output of the comparator.

4. The optical sensor according to claim 2, wherein the other input terminal of the comparator is grounded.

5. The optical sensor according to claim 2, wherein the other input terminal of the comparator is connected to a predetermined reference voltage.

6. The optical sensor according to claim 1, wherein the detection photodetecting element and the reference photodetecting element are photodiodes.

7. A display device comprising:
 an active matrix substrate provided with the optical sensor according to claim 1; and
 a display medium driven by the active matrix substrate.

8. The display device according to claim 7, further comprising:
 a counter substrate facing the active matrix substrate,
 wherein the display medium is a liquid crystal interposed between the active matrix substrate and the counter substrate.

* * * * *